United States Patent
Razzetti et al.

(10) Patent No.: US 10,193,568 B2
(45) Date of Patent: Jan. 29, 2019

(54) OPTICAL COHERENT RECEIVER WITH FORWARD ERROR CORRECTION

(71) Applicant: Alcatel Lucent, Boulogne Billancourt (FR)

(72) Inventors: Luca Razzetti, Vimercate (IT);
Giancarlo Gavioli, Vimercate (IT);
Carlo Constantini, Vimercate (IT);
Marianna Pepe, Milan (IT)

(73) Assignee: Alcatel Lucent, Boulogne-Billancourt (FR)

( * ) Notice: Subject to any disclaimer, the term of this patent is extended or adjusted under 35 U.S.C. 154(b) by 108 days.

(21) Appl. No.: 15/515,336

(22) PCT Filed: Aug. 5, 2015

(86) PCT No.: PCT/EP2015/068009
§ 371 (c)(1),
(2) Date: Mar. 29, 2017

(87) PCT Pub. No.: WO2016/050391
PCT Pub. Date: Apr. 7, 2016

(65) Prior Publication Data
US 2017/0244515 A1    Aug. 24, 2017

(30) Foreign Application Priority Data
Sep. 29, 2014 (EP) .................................. 14306516

(51) Int. Cl.
*H03M 13/11* (2006.01)
*H03M 13/37* (2006.01)
(Continued)

(52) U.S. Cl.
CPC .... *H03M 13/1111* (2013.01); *H03M 13/1145* (2013.01); *H03M 13/2963* (2013.01);
(Continued)

(58) Field of Classification Search
CPC .......... H03M 13/1111; H03M 13/1145; H03M 13/3746; H03M 13/6561
See application file for complete search history.

(56) References Cited

U.S. PATENT DOCUMENTS 6,304,995 B1 * 10/2001 Smith ............... H03M 13/2957
714/786
6,304,996 B1 * 10/2001 Van Stralen ...... H03M 13/2957
714/794
(Continued)

FOREIGN PATENT DOCUMENTS

| JP | 2010-239491 | 10/2010 |
|---|---|---|
| WO | WO 01/08422 A2 | 2/2001 |
| WO | WO 2006/099528 A1 | 9/2006 |

OTHER PUBLICATIONS

International Search Report for PCT/EP2015/068009 dated Nov. 6, 2015.
(Continued)

*Primary Examiner* — Joseph D. Torres
(74) *Attorney, Agent, or Firm* — Fay Sharpe LLP

(57) ABSTRACT

It is disclosed an optical coherent receiver comprising a number of decoding blocks configured to implement iterations of a FEC iterative message-passing decoding algorithm. The decoding blocks are distributed into two (or more) parallel chains of cascaded decoding blocks. The receiver also comprises an intermediate circuit interposed between the two parallel chains. The optical coherent receiver is switchable between (i) a first operating mode, in which the intermediate circuit is inactive and the two parallel chains separately implement the FEC message-passing decoding algorithm on respective client channels; and (ii) a second operating mode, in which the intermediate circuit is active and the two parallel chains jointly implement the FEC message-passing decoding algorithm on a same client channel, by cooperating through the intermediate circuit.

15 Claims, 5 Drawing Sheets

(51) Int. Cl.
  *H03M 13/00* (2006.01)
  *H04B 10/61* (2013.01)
  *H04L 1/00* (2006.01)
  *H03M 13/29* (2006.01)

(52) U.S. Cl.
  CPC ... *H03M 13/2987* (2013.01); *H03M 13/3746* (2013.01); *H03M 13/6561* (2013.01); *H04B 10/616* (2013.01); *H04L 1/005* (2013.01); *H04L 1/0057* (2013.01)

(56) References Cited

U.S. PATENT DOCUMENTS

| | | | |
|---|---|---|---|
| 6,433,904 B1 | 8/2002 | Swanson et al. | |
| 6,570,919 B1* | 5/2003 | Lee | H04L 1/005 375/232 |
| 6,594,792 B1* | 7/2003 | Hladik | H03M 13/2957 714/755 |
| 7,555,684 B1* | 6/2009 | Mazahreh | G11C 8/10 714/702 |
| 7,720,017 B2* | 5/2010 | Khan | H03M 13/2957 370/310 |
| 2001/0010710 A1* | 8/2001 | Kim | H03M 13/256 375/265 |
| 2003/0028843 A1* | 2/2003 | Chang | H03M 13/2957 714/786 |
| 2005/0068918 A1* | 3/2005 | Mantravadi | H04B 7/0669 370/328 |
| 2008/0229172 A1* | 9/2008 | Jego | H03M 13/2771 714/755 |
| 2008/0285688 A1* | 11/2008 | Arzel | H03M 13/23 375/341 |
| 2011/0113294 A1 | 5/2011 | Chugg et al. | |

OTHER PUBLICATIONS

Zhang, Juntan et al., "Shuffled Iterative Decoding", IEEE Transactions on Communications, Feb. 2005, vol. 53, Issue:2, pp. 209-213.

* cited by examiner

OPTICAL COHERENT RECEIVER WITH FORWARD ERROR CORRECTION

TECHNICAL FIELD

The present invention generally relates to the field of communication networks. In particular, the present invention relates to an optical coherent receiver provided with a Forward Error Correction (FEC) mechanism.

BACKGROUND ART

As known, Forward Error Correction (FEC) is a technique for detecting and possibly correcting errors in digital data transmissions between network elements of a digital communication network, e.g. a Wavelength Division Multiplexing (WDM) communication network.

According to FEC, at the transmitting side the digital data to be transmitted are encoded using an error correcting code which adds redundancy. At the receiving side, the redundancy is used to detect, and possibly to correct, errors in the original data.

Different types of error correcting codes are known, including block codes and convolutional codes. In particular, in block codes the digital data to be transmitted are divided into fixed-size blocks of k message symbols and each block is separately encoded into a respective codeword of n symbols by adding n-k redundancy symbols. In general, each symbol is formed by one or more bits. Herein after, for simplicity, it is assumed that each symbol comprises a single bit, which may take the value 0 or 1.

A block code is typically defined by a set of rules for calculating the n-k redundancy bits starting from the k message bits. For instance, in parity-check codes, each one of the n-k redundancy bits is calculated as the parity (namely, the modulo-2 addition) of a certain subset of the k message bits (and therefore is also termed herein after "parity bit"). Each rule corresponds to a respective parity check, which basically provides for checking whether the modulo-2 addition of the parity bit and the subset of the k message bits used for calculating it is equal to zero. A codeword is valid only if all the parity checks are satisfied.

A parity-check code may be also expressed in the form of a binary matrix (also termed parity-check matrix) with n-k rows corresponding to the n-k parity checks and n columns corresponding to the n bits of the codeword.

Amongst the parity-check codes, Low-Density Parity-Check (LDPC) codes are known and presently widely used in WDM communication networks. LDPC codes have parity-check matrixes that contain only a very small number of non-zero entities (namely, they are sparse matrixes). The sparseness of the parity-check matrix guarantees both a decoding complexity which increases only linearly with the code length and a minimum distance which also increases linearly with the code length.

LDPC codes are often represented in graphical form by a Tanner graph. A Tanner graph basically consists of two columns of nodes: a first column of n nodes called "variable nodes" and a second column of n-k nodes called "check nodes". Each variable node corresponds to a respective codeword bit (either a message bit or a parity bit), while each check node corresponds to a respective parity check. In the graph, codeword bits included in a certain parity check have their variable nodes joined to the check node of that parity check. This provides an intuitive graphical representation of the parity checks that define the LDPC code.

LDPC codes are typically decoded using iterative algorithms known as "message-passing algorithms", in that variable nodes and check nodes act like state machines iteratively exchanging messages and updating their states. Different types of message-passing algorithms are known, which differ for the content of the exchanged messages and for the processing carried out at variable nodes and check nodes. A particular class of message-passing algorithms is that of the so-called "belief propagation algorithms", wherein the messages exchanged between a variable node corresponding to a certain codeword bit and the neighboring check nodes comprise probabilities that the codeword bit has the value 1 or 0.

The probability of a codeword bit being equal to 1 or 0 is often expressed as a so-called "log likelihood ratio" (or, briefly, LLR), namely:

$$LLR = \log_{10}\left(\frac{p(0)}{p(1)}\right), \quad [1]$$

where p(0) and p(1) are the probabilities that the codeword bit is equal to 0 and to 1, respectively. Since the values of p(0) and p(1) are comprised between 0 and 1, it is apparent that an LLR>0 indicates that the codeword bit is more probably 0 than 1, while an LLR<0 indicates that the codeword bit is more probably 1 than 0. The higher the modulus of LLR, the higher the certainty of the decision. Besides, LLR=0 indicates that the probabilities that the codeword bit is 1 or 0 are the same.

A particular belief propagation algorithm using the log likelihood ratio LLR is the so-called "sum-product algorithm". According to the sum-product algorithm, each variable node firstly receives as input an a priori probability (in terms of LLR) of its codeword bit, which is typically provided thereto by a preceding component of the receiver, e.g. the demodulator. Then, the variable node calculates an a posteriori probability (in terms of LLR) of its codeword bit, which takes into account both the a priori probability and extrinsic information provided by the neighboring check nodes. The extrinsic information relating to the codeword bit (and therefore the whole a posteriori probability) is refined (and therefore made more accurate) by check node processing at each iteration of the algorithm, namely at each exchange of messages between the variable node and the neighbor check node(s). After a predefined number of iterations, the algorithm ends and the final value of the a posteriori probability is used for taking a hard decision on (namely, assigning the value 0 or 1 to) the codeword bit.

From the implementation point of view, a message-passing algorithm is typically implemented by a FEC decoder comprising a number of cascaded decoding blocks, one per each iteration of the algorithm. Each decoding block receives from the preceding block the a posteriori probabilities or the extrinsic information calculated at the previous iteration, and calculates new, refined a posteriori probabilities or new, refined extrinsic information. The last decoding block then passes the a posteriori probabilities to a hard decision block, which takes a hard decision for each codeword bit (in case of LLRs, based on the sign of the last computed value of its LLR namely, the decided value is 0 if LLR>0 and 1 if LLR<0).

Besides LDPC codes, turbo codes are also known, which provide comparable performance. Turbo codes typically provide three blocks of bits: a first block is formed by the original k message bits to be transmitted, a second block is formed by n/2 first parity bits computed using a convolutional error correcting code on the k message bits, and a third block is formed by n/2 second parity bits computed using the same convolutional error correcting code on a permutation of the k message bits. Thus, two redundant (but different) blocks of parity bits are transmitted with the k message bits.

C. Berrou et al. "Near Optimum Error Correcting Coding and Decoding: Turbo Codes", IEEE Transactions on Communications, Vol. 44, No. 10, October 1996 describes a family of convolutional turbo codes built from a particular concatenation of two recursive systematic codes. Decoding uses an iterative process in which each component decoder takes advantage of the work of the previous step, with the aid of extrinsic information.

U.S. Pat. No. 6,654,927 describes an iterative error-correction for turbo decoding which uses at least two parallel decoding processes and comprises two iterations from which the decoded data is obtained by combining decoded elements of the iterations. Also, for each iteration, an intermediate decoded data element is multiplied by a scaling factor based upon parameters of the previous decoded data element block and is used on the next decoding iteration.

SUMMARY OF THE INVENTION

The inventors have noticed that in coming generations of devices for optical coherent transmission, optical coherent receivers (typically implemented as CMOS devices) will most probably host several client channels—with a typical bitrate of 100 Gbps—in a single monolithic chip. The receiver shall be capable of performing a soft FEC decoding of each client channel.

To this purpose, assuming that an iterative soft decoding algorithm of the type described above is implemented, the optical coherent receiver shall comprise a number of DSP (Digital Signal Processing) blocks—one per each wavelength—and N separate FEC decoders—one per each client channel. Each FEC decoder comprises a respective chain of cascaded decoding blocks. For instance, assuming that the receiver is implemented as a single monolithic CMOS device supporting two wavelengths and 4×100 Gbps client channels, the device shall comprise 2 DSP blocks and 4 FEC decoders.

On the other hand, the inventors have noticed that a trend in devices for optical coherent transmission is that of providing them with more and more flexibility, meaning that a same device shall be capable of being easily configured to operate in different conditions. In particular, the matching between DPSs and FEC decoders shall be easily reconfigurable, according to the spectral efficiency of the modulation constellation used by the DSP block(s). Indeed, in order to increase the number of separate client channels that may be carried by a single optical carrier (namely, a single wavelength) the spectral efficiency shall be increased by using more complicated modulation schemes. However, more complicated modulation schemes result in shorter transmission lengths.

For instance, if each DSP block uses a QPSK constellation on its own wavelength (which provides 100 Gbps at a certain baud rate), each wavelength carries a single 100 Gbps client channel, meaning a 100 Gbps FEC decoder is needed for each DSP block. If instead each DSP block uses a 16QAM constellation (at a same baud rate), each wavelength carries 2×100 Gbps client channels, meaning that two 100 Gbps FEC decoders are needed for each DSP block. If the chip comprises two DSP blocks, 2 FEC decoders are needed in the first case, whereas 4 FEC decoders are needed in the second case.

The inventors have noticed that tailoring the number of FEC decoders optical coherent receiver on the maximum number of client channels and then leaving part of the receiver components unused when the actual number of channels is below the maximum one (e.g. because a less complex modulation scheme is used) disadvantageously results in waste of resources.

In view of the above, it is an object of the present invention to provide an optical coherent receiver which solves this drawback.

In particular, it is an object of the present invention to provide an optical coherent receiver which is flexible in that it may be easily configured to operate in different scenarios (in particular, with different number of client channels) even when it is implemented as a single, monolithic device and which—when the actual number of client channels is below the maximum one which the receiver may support—may be operated so that the waste of resources in minimized.

According to a first aspect, the present invention provides an optical coherent receiver comprising a number of decoding blocks, each decoding block being configured to implement an iteration of a forward error correction iterative message-passing decoding algorithm, the number of decoding blocks being distributed into at least two parallel chains of cascaded decoding blocks, wherein the optical coherent receiver also comprises at least one intermediate circuit interposed between the two parallel chains, wherein the optical coherent receiver is switchable between:
- a first operating mode, in which the intermediate circuit is inactive and each one of the two parallel chains separately implements the forward error correction message-passing decoding algorithm on a respective client channel; and
- a second operating mode, in which the intermediate circuit is active and the two parallel chains jointly implement the forward error correction message-passing decoding algorithm on a same client channel by cooperating through the intermediate circuit.

Preferably, a first chain of cascaded decoding blocks comprise a first decoding block and a second chain of cascaded decoding blocks comprise a second decoding block, the first decoding block and the second decoding block being suitable for performing an i-th iteration of the algorithm.

According to a first embodiment, in the first operating mode:
- the first decoding block is configured to receive from a preceding decoding block of the first chain a posteriori probabilities of message symbols of a first codeword of a first client channel as calculated at a preceding iteration of the algorithm based on redundancy symbols of the first codeword, and to update the a posteriori probabilities of the message symbols of the first codeword based on the redundancy symbols of the first codeword; and
- the second decoding block is configured to receive from a preceding decoding block of the second chain a posteriori probabilities of message symbols of a second codeword of a second client channel as calculated at a preceding iteration of the algorithm based on redundancy symbols of the second codeword, and to update the a posteriori probabilities of the message symbols of the second codeword based on the redundancy symbols of the second codeword.

Preferably, according to the first embodiment, in the second operating mode:
- the first decoding block is configured to receive from the intermediate circuit joint a posteriori probabilities of message symbols of a codeword of a client channel as calculated at a preceding iteration of the algorithm based on first redundancy symbols and second redundancy symbols of the codeword, and to calculate a posteriori probabilities of the message symbols of the codeword based on the first redundancy symbols only;
- the second decoding block is configured to receive from the intermediate circuit the joint a posteriori probabilities of the message symbols of the codeword of the client channel as calculated at the preceding iteration of the algorithm based on the first redundancy symbols and the second redundancy symbols of the codeword, and to calculate a posteriori probabilities of the message symbols of the codeword based on the second redundancy symbols only; and
- the intermediate circuit is configured to calculate updated joint a posteriori probabilities of the message symbols taking into account both the a posteriori probabilities calculated based on the first redundancy symbols and the a posteriori probabilities calculated based on the second redundancy symbols.

Preferably, according to the first embodiment, the a posteriori probabilities of the message symbols are in the form of log likelihood ratios, and the intermediate circuit is configured to calculate the updated joint a posteriori probabilities of the message symbols as the summation of the a posteriori probabilities calculated based on the first redundancy symbols and the a posteriori probabilities calculated based on the second redundancy symbols, decreased by a priori probabilities of the message symbols.

Preferably, the joint a posteriori probabilities of the message symbols are calculated every X iterations of the algorithm, X being equal to or higher than 1.

According to an alternative embodiment, in the second operating mode:
- the first decoding block is configured to receive from the intermediate circuit a posteriori probabilities of message symbols of a codeword of a client channel as calculated at a preceding iteration of the algorithm, and to update the a posteriori probabilities of the message symbols based on first redundancy symbols of the codeword; and
- the second decoding block is configured to receive from the first decoding block via the intermediate circuit the updated a posteriori probabilities of the message symbols and to further update them based on second redundancy symbols of the codeword.

According to other embodiments, in the first operating mode:
- the first decoding block is configured to receive from a preceding decoding block of the first chain a posteriori probabilities of message symbols of a first codeword of a first client channel as calculated at a preceding iteration of the algorithm based on redundancy symbols of the first codeword, and to calculate extrinsic probabilities of the message symbols of the first codeword based on the redundancy symbols of the first codeword;
- the second decoding block is configured to receive from a preceding decoding block of the second chain a posteriori probabilities of message symbols of a second codeword of a second client channel as calculated at a preceding iteration of the algorithm based on redundancy symbols of the second codeword, and to calculate extrinsic probabilities of the message symbols of the second codeword based on the redundancy symbols of the second codeword.

According to such embodiments, in the second operating mode:
- the first decoding block is configured to receive from the intermediate circuit joint a posteriori probabilities of message symbols of a codeword of a client channel as calculated at a preceding iteration of the algorithm based on first redundancy symbols and second redundancy symbols of the codeword, and to calculate extrinsic probabilities of the message symbols of the codeword based on the first redundancy symbols only;
- the second decoding block is configured to receive from the intermediate circuit the joint a posteriori probabilities of message symbols of the codeword of the client channel as calculated at the preceding iteration of the algorithm based on the first redundancy symbols and the second redundancy symbols of the codeword, and to calculate extrinsic probabilities of the message symbols of the codeword based on the second redundancy symbols only; and
- the intermediate circuit is configured to calculate updated joint a posteriori probabilities of the message symbols taking into account both the extrinsic probabilities calculated based on the first redundancy symbols and the extrinsic probabilities calculated based on the second redundancy symbols.

According to such embodiments, preferably, the extrinsic probabilities of the message symbols are in the form of log likelihood ratios, and the intermediate circuit is configured to calculate the updated joint a posteriori probabilities of the message symbols as the summation of the extrinsic probabilities calculated based on the first redundancy symbols, the extrinsic probabilities calculated based on the second redundancy symbols, and a priori probabilities of the message symbols.

According to advantageous variants of such embodiments, the intermediate circuit is also configured to multiply the extrinsic probabilities calculated based on the first redundancy symbols and the extrinsic probabilities calculated based on the second redundancy symbols by respective weights, before there are summed.

Preferably, the first redundancy symbols of the codeword are calculated by applying a first error correcting code to the message symbols of the codeword and the second redundancy symbols of the codeword are calculated by applying a second error correcting code to a permutation of the message symbols of the codeword.

Preferably, the first error correcting code and the second error correcting code are a low density parity check code.

Preferably, the number of decoding blocks is distributed into M parallel chains of cascaded decoding blocks, M being equal to a maximum number of client channels which the receiver shall be able to receive and process.

According to a second aspect, the present invention provides a method for operating an optical coherent receiver comprising a number of decoding blocks, each decoding block being configured to implement an iteration of a forward error correction iterative message-passing decoding algorithm, the number of decoding blocks being distributed into at least two parallel chains of cascaded decoding blocks, wherein the optical coherent receiver also comprises at least one intermediate circuit interposed between the two parallel chains, wherein the method comprises switching the optical coherent receiver between:

a first operating mode, in which the intermediate circuit is inactive and each one of the two parallel chains separately implements the forward error correction message-passing decoding algorithm on a respective client channel; and a second operating mode, in which the intermediate circuit is active and the two parallel chains jointly implement the forward error correction message-passing decoding algorithm on a same client channel by cooperating through the intermediate circuit.

BRIEF DESCRIPTION OF THE DRAWINGS

Embodiments of the invention will be better understood by reading the following detailed description, given by way of example and not of limitation, to be read with reference to the accompanying drawings, wherein.

DETAILED DESCRIPTION OF PREFERRED EMBODIMENTS OF THE INVENTION

Figure 1:
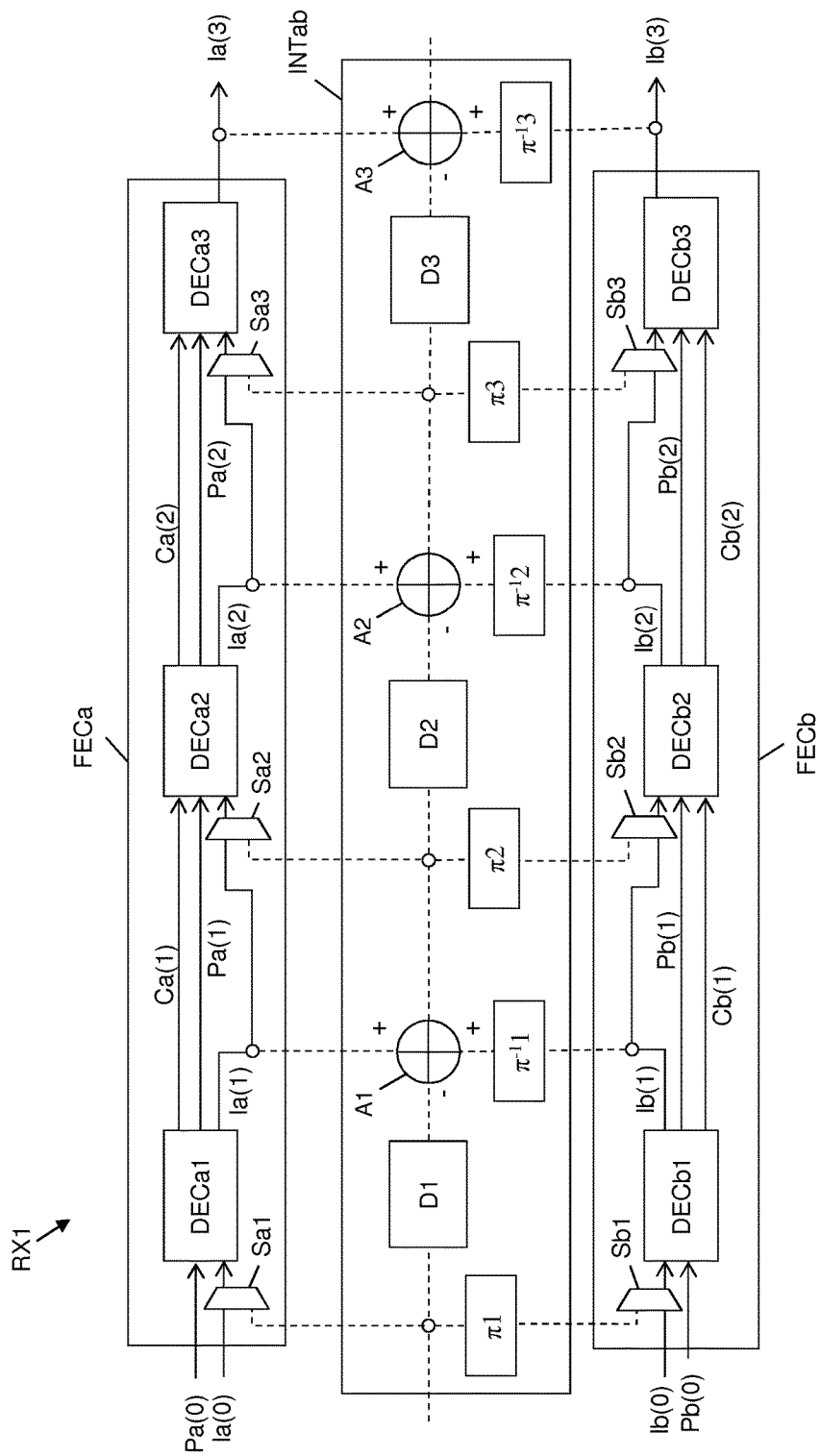
FIG. 1 is a block diagram of a portion of an optical coherent according to a first embodiment of the present invention, in a first operating mode.

FIG. 1 shows a portion of an optical coherent receiver RX1 according to a first embodiment of the present invention.

The portion of optical coherent receiver RX1 shown in FIG. 1 comprises a number of DSP blocks (not shown for simplicity) and a number M of FEC decoding chains. For not overloading the drawing, in FIG. 1 only two decoding chains FECa and FECb are shown. In general, however, the number M of decoding chains comprised in the optical coherent receiver RX1 is equal to the maximum number of client channels which the receiver RX1 shall be able to receive and process. For instance, if the receiver RX1 shall be able to receive and process at most 10 client channels, the number M of FEC decoding chains is 10. Preferably, the number M of FEC decoding chains is an even number equal to or higher than 2.

Each FEC decoding chain FECa, FECb is preferably configured to implement an iterative, soft FEC decoding algorithm on a respective client channel, as described above. In particular, each FEC decoding chain FECa, FECb is preferably configured to implement a message-passing algorithm for decoding an LDPC code, more preferably a belief propagation algorithm such as e.g. the known sum-product, or the known min-sum algorithm. To this purpose, each FEC decoding chain FECa, FECb preferably comprises a respective number $k \geq 2$ of cascaded decoding blocks, each block being configured to perform a respective iteration of the algorithm. By way of non limiting example, each one of the FEC decoding chains FECa, FECb shown in FIG. 1 comprises three decoding blocks DECa1, DECa2, DECa3 and DECb1, DECb2, DECb3. This is however not limiting. More generally, the number K of cascaded decoding blocks is determined as the number of iterations above which additional iterations entail a negligible improvement of the accuracy of the algorithm results. In any case, the upper limit of K is determined by the area available on the chip and by power consumption constraints. The number K of cascaded decoding blocks is preferably the same for all the FEC decoding chains of the receiver RX1.

Figure 2:
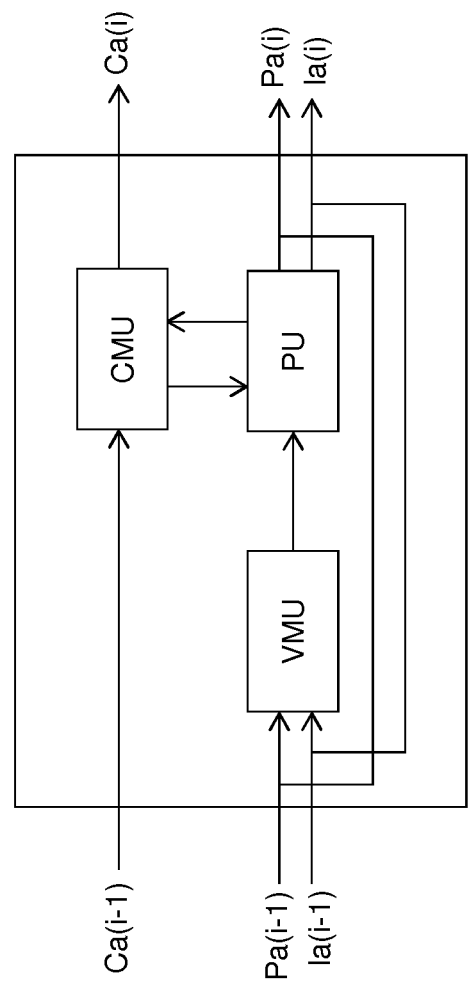
FIG. 2 is a more detailed block diagram of a single decoding block of the optical coherent receiver shown in FIG. 1.

All decoding blocks preferably have a same structure DECa1, DECa2, DECa3 and DECb1, DECb2, DECb3, which is schematically depicted in FIG. 2. In particular, FIG. 2 schematically shows the decoding block DECai, wherein i=1, 2, 3.

The decoding block DECai preferably comprises two memory units CMU, VMU and a processing unit PU. A first memory unit CMU is preferably connected to a first input (also termed check input) of the decoding block DECai, while a second memory unit VMU is preferably connected to a second input (also termed "parity input") and a third input (also termed "message input") of the decoding block DECai. The first memory unit CMU is also bidirectionally connected to the processing unit PU, whereas the second memory unit VMU is connected to the processing unit PU according to a feedback configuration. The first memory unit CMU is also connected to a first output (also termed "check output") of the decoding block DECai, whereas the processing unit PU is connected to a second output (also termed "parity output") and a third output (also termed "message output") of the decoding block DECai.

According to embodiments of the present invention, the optical coherent receiver also comprises a number M' of intermediate circuits. The number M' of intermediate circuits is preferably M/2, namely half the number of FEC decoding chains. Each intermediate circuit is preferably interposed between two adjacent FEC decoding chains. Hence, in FIG. 1 a single intermediate circuit INTab is shown, which is interposed between the FEC decoding chains FECa and FECb. Each intermediate circuit comprises a number K of cascaded building blocks, namely a number of building blocks equal to the number K of decoding blocks comprised in each FEC decoding chain. Hence, the intermediate circuit INTab shown in FIG. 1 comprises K=3 building blocks. Each building block of the intermediate circuit INTab preferably comprises a delay line D1, D2, D3, an adder A1, A2, A3, an interleaver $\pi1$, $\pi2$, $\pi3$ and a de-interleaver $\pi^{-1}1$, $\pi^{-1}2$, $\pi^{-1}3$.

According to embodiments of the present invention, each FEC chain also preferably comprises a number K of switches. In particular, each FEC chain FECa, FECb shown in FIG. 1 comprises K=3 switches Sa1, Sa2, Sa3 and Sb1, Sb2, Sb3, respectively. Within each FEC chain, each switch is connected to the message input of a respective decoding block. In particular, each switch is switchable to selectively connect the message input of the subsequent decoding block to either the message output of the preceding decoding block (as shown in FIG. 1) or the intermediate circuit INTab.

More particularly, within the FEC chain FECa, the switch Sa1 is switchable to selectively connect the message input of the decoding block DECa1 to either the input of the FEC chain FECa (FIG. 1) or a common input of the intermediate circuit INTab (FIG. 3), while the switches Sa2, Sa3 are switchable to selectively connect the message input of the decoding block DECa2, DECa3 to either the message output of the decoding block DECa1, DECa2 (FIG. 1) or the output of the adder A1, A2 (FIG. 3), respectively.

Figure 3:
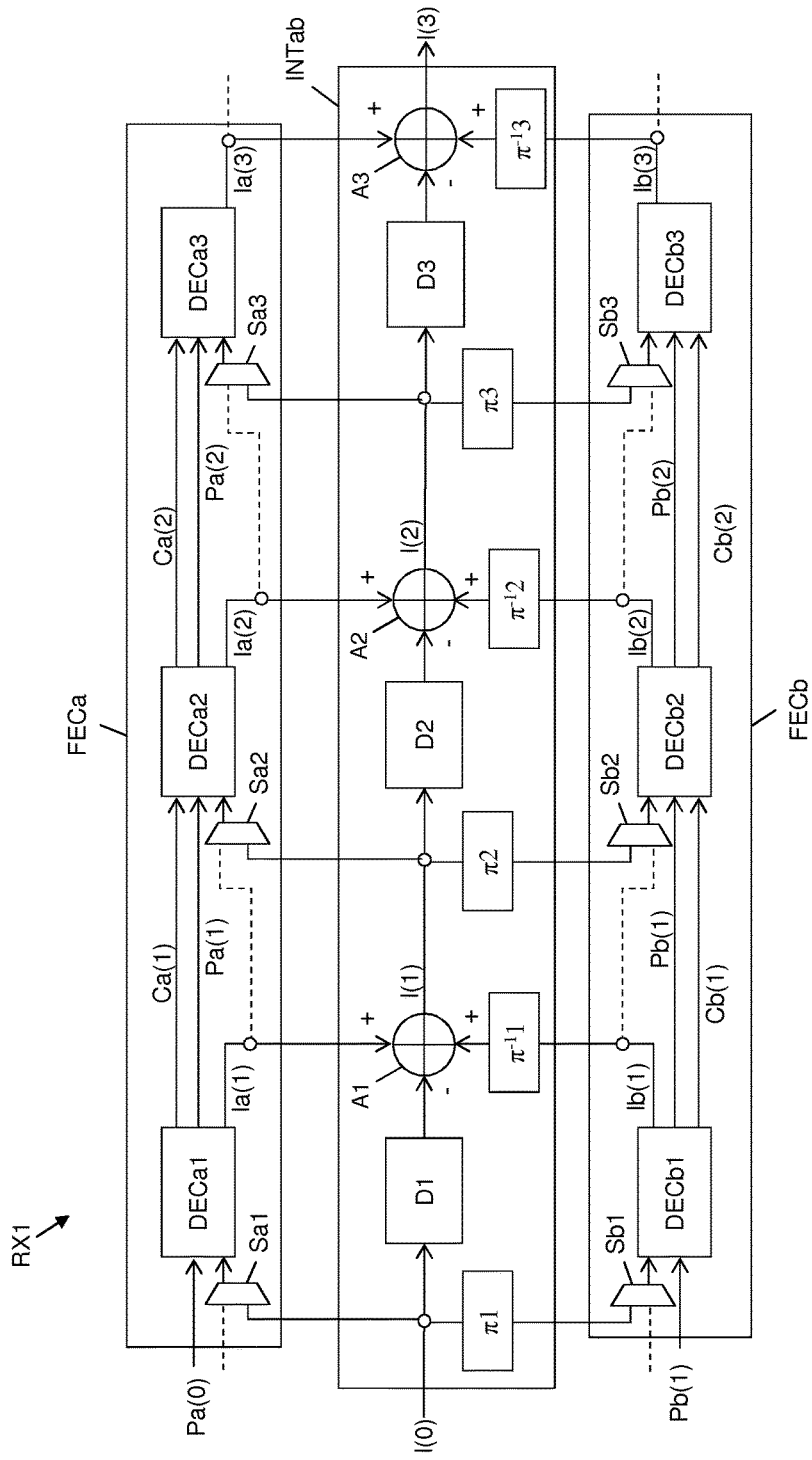
FIG. 3 schematically shows the optical coherent receiver of FIG. 1 in a second operating mode.

Besides, within the FEC chain FECb, the switch Sb1 is switchable to selectively connect the message input of the decoding block DECb1 to either the input of the FEC chain FECb (FIG. 1) or the output of the interleaver π1 (FIG. 3), while the switches Sb2, Sb3 are switchable to selectively connect the message input of the decoding block DECb2, DECb3 to either the message output of the decoding block DECb1, DECb2 (FIG. 1) or to the output of the interleaver π2, π3 (FIG. 3).

It may be appreciated that in the first configuration of switches Sa1, Sa2, Sa3 and Sb1, Sb2, Sb3 (FIG. 1), the two FEC chains FECa, FECb are uncoupled, whereas in the second configuration of switches Sa1, Sa2, Sa3 and Sb1, Sb2, Sb3 the FEC chains are coupled (or aggregated) via the intermediate circuit INTab.

The optical coherent receiver RX1 comprises other components located both upstream and downstream the FEC decoding chains and intermediate circuits (e.g. the above mentioned DSP blocks). However, such components are not shown in the drawings, since they are not relevant to the present description.

The operation of the optical coherent receiver RX1 (and in particular of the FEC chains and intermediate circuits) will be now described in detail.

The optical coherent receiver RX1 is preferably switchable between:
- a first operation mode (shown in FIG. 1), in which the intermediate circuit INTab is inactive (preferably, it is switched off) and the two FEC decoding chains FECa, FECb separately apply a FEC decoding to two separate client channels; and
- a second operation mode (shown in FIG. 3), in which the intermediate circuit INTab is active and the two FEC decoding chains FECa, FECb are aggregated and cooperate via the intermediate circuit INTab, so as to jointly perform a turbo FEC decoding to a single client channel.

The operation of the coherent receiver RX1 according to the first operation mode will be now described in further detail, with reference e.g. to the first FEC decoding chain FECa.

Herein after, by way of non limiting example, it is assumed that the client channel received at the receiver RX1 and decoded by the FEC decoding chain FECa is encoded according to an LDPC code defined by k-n parity checks providing valid codewords of n bits. As described above, such LDPC code may be described by a Tanner graph comprising n variable nodes (including k variable nodes corresponding to the k message bits of each codeword and n-k variable nodes corresponding to the n-k parity bits of each codeword) and n-k check nodes (corresponding to the n-k parity checks defining the LDPC code).

Within the chain FECa, the decoding block DECai preferably receives from the preceding decoding block:
- the state Ca(i−1) of the check nodes at the previous iteration of the algorithm. The state Ca(i−1) is defined as the set of the extrinsic probabilities (preferably, in the form of LLRs) of the codeword bits Lea(i−1)$_{vc}$ calculated by the check nodes at the previous iteration, where v is the variable node index (varying between 1 and n) and c is the check node index (varying from 1 to n-k). For the first decoding block DECa1, Lea(i−1)$_{vc}$=0 for all values of the index v and all values of the index c (since FEC decoding is not started yet, no extrinsic information are available yet);
- the state Ia(i−1) of the variable nodes corresponding to the k message bits at the previous iteration of the algorithm. The state Ia(i−1) is preferably defined as the set of a posteriori probabilities (preferably, in the form of LLRs) of the message bits calculated by the respective variable nodes at the previous iteration; and
- the state Pa(i−1) of the variable nodes corresponding to the n-k parity bits at the previous iteration of the algorithm. The state Pa(i−1) is preferably is defined as the set of a posteriori probabilities (preferably, in the form of LLRs) of the parity bits calculated by the respective variable nodes at the previous iteration.

In particular, for each codeword bit, the a posteriori probability at the previous iteration in terms of LLR is preferably equal to:

$$L_V + \sum_C Lea(i-1)_{VC} \quad [2]$$

where $L_v$ is the a priori probability (in terms of LLR) of the codeword bit as provided by the components upstream the FEC chain FECa (e.g. the demodulator, not shown in the drawings for simplicity), v is the variable node index (varying between 1 and n) and c is the check node index. For the first decoding block DECa1, the received a posteriori probabilities are equal to the respective a priori probabilities $L_v$ for all values of the index v, because the extrinsic probabilities are all equal to 0.

Preferably, the decoding block DECai receives the state Ca(i−1) via its first input, and preferably stores it in the first memory unit CMU. Besides, the decoding block DECai preferably receives the states Ia(i−1) and Pa(i−1) via its second and third inputs, respectively, and preferably stores them in the second memory unit VMU. It shall be noticed that, according to the first operating mode, all the codeword bits (parity bits and message bits) are treated the same way.

Then, the processing unit PU of the decoding block DECai preferably updates the states Ca(i−1), Ia(i−1) and Pa(i−1) as received from the preceding decoding block in order to provide updated states Ca(i), Ia(i) and Pa(i) to the subsequent decoding block.

The processing unit PU in particular uses the a posteriori probabilities of the old states Ia(i−1) and Pa(i−1) to update the extrinsic probabilities of the old state Ca(i−1), so as to provide an updated state Ca(i). Then, the processing unit PU uses the updated extrinsic probabilities of the new state Ca(i) and the old extrinsic probabilities Ca(i−1) to update the a posteriori probabilities of both the message bits and the parity bits, so as to provide updated states Ia(i) and Pa(i).

Even more particularly, the processing unit PU preferably processes the check nodes in a sequential/TDM way. In particular, for each check node c* the processing unit PU preferably:
- reads from the first memory unit CMU the extrinsic probabilities Lea(i−1)vc* included in the previous state Ca(i−1);
- reads from the second memory unit VMU the a posteriori probabilities of the adjacent variable nodes included in the previous state Ia(i−1) and/or Pa(i−1);
- based on such "old" a posteriori probabilities and the parity checks, calculates new extrinsic probabilities Lea(i)vc*, which will be included in the new state Ca(i); and
- calculates new a posteriori probabilities—which will be included in the updated state Ia(i) and/or Pa(i)—by subtracting from the "old" a posteriori probabilities the corresponding old extrinsic probabilities Lea(i−1)vc* and adding thereto the corresponding new extrinsic probabilities Lea(i)vc*, namely:

$$L_V + \sum_C Lea(i-1)_{VC} - Lea(i-1)_{VC^*} + Lea(i)_{VC^*} \qquad [3]$$

The new state Ca(i) is preferably stored in the first memory unit CMU, while the new states Ia(i) and Pa(i) are preferably stored in the second memory unit VMU, in case a variable node is connected to more then one check node in the Tanner graph, and accordingly needs to be processed more than once. When the last processing for all the variable nodes within an iteration of the algorithm is completed, the updated states Ca(i), Pa(i) and Ia(i) are preferably sent to the next decoding block DECa(i+1) (if any), which receives and processes them in the same way. Alternatively, the information relating a check node or variable node is sent to the next decoding block as soon as it is no more useful for the processing at the current iteration.

If the decoding block DECai is instead the last decoding block of the FEC decoding chain (see the block DECa3 in the FEC decoding chain FECa of FIG. 1), then the a posteriori probabilities of the variable nodes corresponding to the message bits are sent to a hard decision block (not shown for simplicity), while the a posteriori probabilities of the variable nodes corresponding to parity bits are discarded. The hard decision block then assigns a value 0 or 1 to each message bit, depending on its a posteriori probability. In case the probabilities are in the form of LLRs, the hard decision is based on the sign of the LLR, a positive LLR resulting in a message bit equal to 0 and a negative LLR resulting in a message bit equal to 1.

Preferably, in the first operating mode of the receiver RX1 each decoding block DECa1, DECa2, DECa3 of the FEC decoding chain FECa operates as described above, thereby implementing a three-iteration FEC decoding of the received client channel (see FIG. 1). Preferably, in the first operating mode of the receiver RX1 the FEC decoding chain FECb receives a further client channel. The operation of the decoding blocks DECb1, DECb2, DECb2 is similar to that of decoding block DECa1, DECa2, DECa3, so that the FEC decoding chain FECb implements a three-iteration FEC decoding of the further client channel. Hence, the two FEC decoding chains FECa, FECb basically work in parallel on two different client channels, in a reciprocally independent way.

With reference to FIG. 3, the operation of the receiver RX1 in the second operating mode will be now described in detail.

As mentioned above, in the second operating mode the intermediate circuit INTab is active, and the two FEC decoding chains FECa, FECb jointly apply a turbo decoding on a same client channel.

Herein after, it is assumed that the client channel received at the receiver RX1 and jointly decoded by the FEC decoding chains FECa and FECb is encoded by using a turbo FEC code, e.g. based on one or more LDPC codes. Hence, each codeword comprises n+n'-k bits divided into three blocks: a first block of k message bits, a second block of n-k first parity bits calculated on the k messages bits using a first LDPC code defined by n-k parity checks, and a third block of n'-k second parity bits calculated on a permutation of the k message bits using a second LDPC code defined by n'-k parity checks. Herein after, by way of non limiting example, it is assumed that a same LDPC code defined by n-k parity checks is applied for calculating both the first parity bits and the second parity bits of each codeword, which accordingly comprises 2n-k bits.

This LDPC-based turbo code may be represented in the form of a Tanner graph. A first graph comprises n first variable nodes (k for the message bits and n-k for the first parity bits) and n-k first check nodes (for the n-k parity checks providing the first parity bits). A second graph comprises n second variable nodes (k for the k permutated message bits and n-k for the second parity bits) and n-k second check nodes (for the n-k parity checks providing the second parity bits).

According to the present invention, when the receiver RX is operated in the second mode, the first FEC decoding chain FECa basically processes and updates the states of the first variable nodes and the first check nodes as described above in connection with the first operating mode. At the same time (namely, during the same set of clock cycles), the second FEC decoding chain FECb processes the states of the second variable nodes and the second check nodes as described above in connection with the first operating mode. However, the two FEC decoding chains FECa, FECb cooperate in that, according to the first embodiment of the invention, upon completion of each iteration, the state of the first variable nodes corresponding to the k message bits and the state of the second variable nodes corresponding to the k permutated message bits are merged in a single joint state, which is provided at the input of the next iteration to both the FEC chains FECa, FECb. This merging is implemented by the intermediate circuit INTab, as it will be described in detail herein after.

According to the first embodiment, the decoding block DECa1 receives from the preceding component (e.g. the demodulator, not shown in the drawings) the state I(0) of the first variable nodes corresponding to the k message bits and the state Pa(0) of the first variable nodes corresponding to the n-k first parity bits at the previous iteration of the algorithm. As mentioned above, the state I(0) is preferably defined as the set of a priori probabilities (preferably, in the form of LLRs) Lv of the message bits while the state Pa(0) is preferably defined as the set of a priori probabilities (preferably, in the form of LLR) Lv of the first parity bits.

The decoding block DECa1 then preferably processes them as described above with reference to FIG. 2, so as to provide updates states Pa(1) and Ia(1) for the first variable nodes and to generate a state Ca(1) for the first check nodes. In particular the decoding block DECa1 uses the a priori probabilities of the message bits and first parity bits of states I(0) and Pa(0) to calculate extrinsic probabilities of the message bits and first parity bits, so as to provide a state Ca(1) of the first check nodes. Then, the decoding block DECa1 uses such extrinsic probabilities to calculate a posteriori probabilities of both the message bits and the first parity bits, so as to provide updated states Ia(1) and Pa(1). The a posteriori probabilities of the message bits, which form state Ia(1), in particular are provided by the following equation:

$$L_V + \sum_C Lea(1)_{VC} \qquad [4a]$$

Lea(1)$_{vc}$ being the extrinsic probabilities calculated by the first check nodes.

Substantially at the same time, also the decoding block DECb1 receives from the preceding component (e.g. the demodulator, not shown in the drawings) the state I(0) of the second variable nodes corresponding to the k message bits, preferably permutated by the interleaver π1. The decoding block DECb1 also receives the state Pb(0) of the second variable nodes corresponding to the n-k second parity bits at the previous iteration of the algorithm. The state Pb(0) is preferably defined as the set of a priori probabilities (preferably, in the form of LLR) Lv of the second parity bits.

The decoding block DECb1 preferably processes them as described above with reference to FIG. 2, so as to provide updates states Pb(1) and Ib(1) for the second variable nodes and to generate a state Cb(1) for the second check nodes. In particular the decoding block DECb1 uses the a priori probabilities of the permutated message bits and second parity bits of states I(0) and Pb(0) to calculate extrinsic probabilities of the permutated message bits and second parity bits, so as to provide a state Cb(1) of the second check nodes. Then, the decoding block DECb1 uses such extrinsic probabilities to calculate a posteriori probabilities of both the permutated message bits and the second parity bits, so as to provide updated states Ib(1) and Pb(1). The a posteriori probabilities of the message bits, which form state Ib(1), in particular are provided by the following equation:

$$L_V + \sum_C Leb(1)_{VC} \quad [4b]$$

Leb(1)$_{vc}$ being the extrinsic probabilities calculated by the second check nodes.

According to the first embodiment, a joint state I(1) for the variable nodes corresponding to the message bits is then calculated, which is formed by a set of joint a posteriori probabilities of the message bits which take into account both the a posteriori probabilities provided by the FEC chain FECa and the a posteriori probabilities provided by the FEC chain FECb.

In particular, the joint a posteriori probabilities of the message bits are provided by the following equation:

$$\left(L_V + \sum_C Lea(1)_{VC}\right) + \left(L_V + \sum_C Leb(1)_{VC}\right) - L_V = \quad [5]$$
$$L_V + \sum_C Lea(1)_{VC} + \sum_C Leb(1)_{VC}$$

Equation [5] is implemented by the de-interleaver $\pi^{-1}1$ (which counter-permutes the a posteriori probabilities of state Ib(1)), the delay line D1 and the adder A1.

Hence, each message bit has a joint a posteriori probability which is the sum of its a priori probability, its extrinsic probabilities calculated by the FEC decoding chain FECa and the extrinsic probabilities calculated by the FEC decoding chain FECb.

This joint state I(1) of the variable nodes corresponding to the message bits is then provided to both the second decoding block DECa2 of the FEC decoding chain FECa (which also receives the states Ca(1) and Pa(1) from the preceding decoding block DECa1) and to the second decoding block DECb2 of the FEC decoding chain FECb (which also receives the states Cb(1) and Pb(1) from the preceding decoding block DECb1).

The operation of the second decoding blocks DECa2, DECb2 is substantially the same as the first blocks DECa1, DECb1. Hence, it will be not repeated in detail. It is only remarked that, upon completion of the processing (which basically is the second iteration of the algorithm), the decoding block DECa2 (or DECb2) provides at its outputs:

an updated state Ca(2) (or Cb(2)) of the first (or second) check nodes, comprising the extrinsic probabilities of the messages bits and first (or second) parity bits calculated by the neighboring first (or second) check nodes;

an updated state Pa(2) (or Pb(2)) of the first (or second) variable nodes corresponding to the first (or second) parity bits, comprising the a posteriori probabilities of the first (or second) parity bits; and an updated state Ia(2) (or Ib(2)) of the first (or second) variable nodes corresponding to the message bits (or permutated message bits), comprising the a posteriori probabilities of the message bits (or permutated message bits) calculated taking into account the extrinsic probabilities provided by the first (or second) check nodes only.

Again, according to the first embodiment the states Ia(2), Ib(2) are merged by the intermediate circuit INTab into a joint state I(2), which is formed by a set of joint a posteriori probabilities of the message bits calculated according to the following equation:

$$\left(L_V + \sum_C Lea(2)_{VC} + \sum_C Leb(1)_{VC}\right) + + \left(L_V + \sum_C Lea(1)_{VC} + \sum_C Leb(2)_{VC}\right) + - \left(L_V + \sum_C Lea(1)_{VC} + \sum_C Leb(1)_{VC}\right) = \left(L_V + \sum_C Lea(2)_{VC} + \sum_C Leb(2)_{VC}\right) \quad [6]$$

Equation [6] is implemented by de-interleaver $\pi^{-1}1$ (which counter-permutes the a posteriori probabilities of state Ib(2)), the delay line D2 and the adder A2. Again, from equation [6] it may be seen that the joint a posteriori probability of each message bit is the sum of its a priori probability, its extrinsic probabilities calculated by the FEC decoding chain FECa and the extrinsic probabilities calculated by the FEC decoding chain FECb.

This joint state I(2) of the variable nodes corresponding to the message bits is then provided to both the third decoding block DECa3 of the FEC decoding chain FECa (which also receives the states Ca(2) and Pa(2) from the preceding decoding block DECa2) and to the third decoding block DECb3 of the FEC decoding chain FECb (which also receives the states Cb(2) and Pb(2) from the preceding decoding block DECb2).

The operation of the third decoding blocks DECa3, DECb3 is substantially the same as the first blocks DECa1, DECb1 and second blocks DECa2, DECb2. Hence, it will not be repeated. It is only remarked that, upon completion of the processing (which basically is the third iteration of the algorithm), the decoding block DECa3 (or DECb3) provides an updated state Ca(3) (or Cb(3)) of the first (or second) check nodes, an updated state Pa(3) (or Pb(3)) of the first (or second) variable nodes corresponding to the first (or second) parity bits, and an updated state Ia(3) (or Ib(3)) of the first (or second) variable nodes corresponding to the message bits.

Again, according to the first embodiment the updated states Ia(3) Ib(3) are merged by the intermediate stage INTab into a joint state I(3), which comprises joint a posteriori probabilities of the message bits which are calculated as described above.

Assuming, for simplicity and by way of non limiting example, that the algorithm provides for three iterations only, the joint a posteriori probabilities of state I(3) are then sent to the hard decision block (not shown in the drawings for simplicity). The hard decision block then assigns a value 0 or 1 to each message bit, depending on its joint a posteriori probability. In case the probabilities are in the form of LLRs, the hard decision is based on the sign of the LLR, a positive LLR resulting in a message bit equal to 0 and a negative LLR resulting in a message bit equal to 1.

The optical coherent receiver RX exhibits several advantages.

First of all, it is highly flexible, meaning that it may be easily configured to operate in different conditions. For instance, the receiver RX1 may be easily configured to operate with different modulation schemes that, as described above, in view of their different spectral efficiencies allow transmitting a different number of client channels over each optical carrier. For instance, if the receiver RX1 comprises at least eight FEC decoding chains similar to chains FECa, FECb described above and at least four intermediate circuits similar to the stage INTab described above, the receiver RX1 may be easily switched between:

the first operating mode, in which the four intermediate circuits are switched off and the eight FEC decoding chains separately process e.g. 8×100 Gbps client channels modulated using a 16 QAM scheme; and the second operating mode, in which the four intermediate circuits are active and the eight FEC decoding chains are aggregated two-by-two by the intermediate circuits, so that e.g. 4×100 Gbps client channels modulated using a QPSK scheme are decoded.

Besides, in the receiver RX1 the waste of resources occurring when not all client channels are used is minimized. Indeed, with reference e.g. to the above example, when the number of client channels passes e.g. from 8 to 4, the decoding chains are advantageously aggregated for implementing a turbo FEC mechanism of the remaining channels, instead of being switched off or left unused. The turbo FEC mechanism advantageously exhibits higher performance than "normal" FEC, which are particularly desirable when less complex modulation schemes (such as QPSK) are used, with more demanding reach.

It shall also be noticed that such advantages are achieved with a little increase of the complexity of the circuit which implements FEC decoding at the receiver RX1. The intermediates circuits for aggregating the FEC decoding chains in the second operating mode of the receiver RX1 indeed exhibit a very reduced complexity in comparison to the FEC decoding chains themselves. Each intermediate circuit indeed comprise adders, delay lines, interleavers and de-interleavers, namely components whose complexity is negligible compared e.g. to the complexity of the processing unit included in each decoding stage of the FEC chains. In particular, in case LDPC codes are used, the permutations performed by the interleavers and de-interleavers may be reduced to a number of permutations of small blocks of information, so that they may be implemented with simple logic without memory.

Though in the above detailed description of the receiver RX1 reference has been made to LDPC codes only, this is not limiting. Indeed, according to other variants not shown in the drawings, a receiver with a similar FEC decoding circuit may be implemented for any other type of error correcting code, in particular any block code or any convolutional code.

Furthermore, though in the receiver RX1 according to the first embodiment the states Ia(i) and Ib(i) of the variable nodes corresponding to the message bits and the permutated message bits, respectively, are merged at each iteration of the algorithm (namely, a delay line and an adder are provided at the output of each couple of decoding blocks DECai, DECbi), this is also not limiting. According to other variants not shown in the drawings, the merging of the states Ia(i) and Ib(i) may be made every arbitrary number of iterations. The optimum merging pattern may be calculated using e.g. the known exit chart analysis or, for LDPC codes, the known Density Evolution algorithm.

Furthermore, though in the above description it has been assumed that—in the second operating mode of the receiver RX1—a same error correcting code is applied for calculating both the first parity bits and the second parity bits of each codeword, according to other variants two different codes may be applied to the same k message bits of the codeword. Furthermore, according to still other embodiments more than two FEC chains may be coupled to jointly decode a same client channel.

Figure 4:
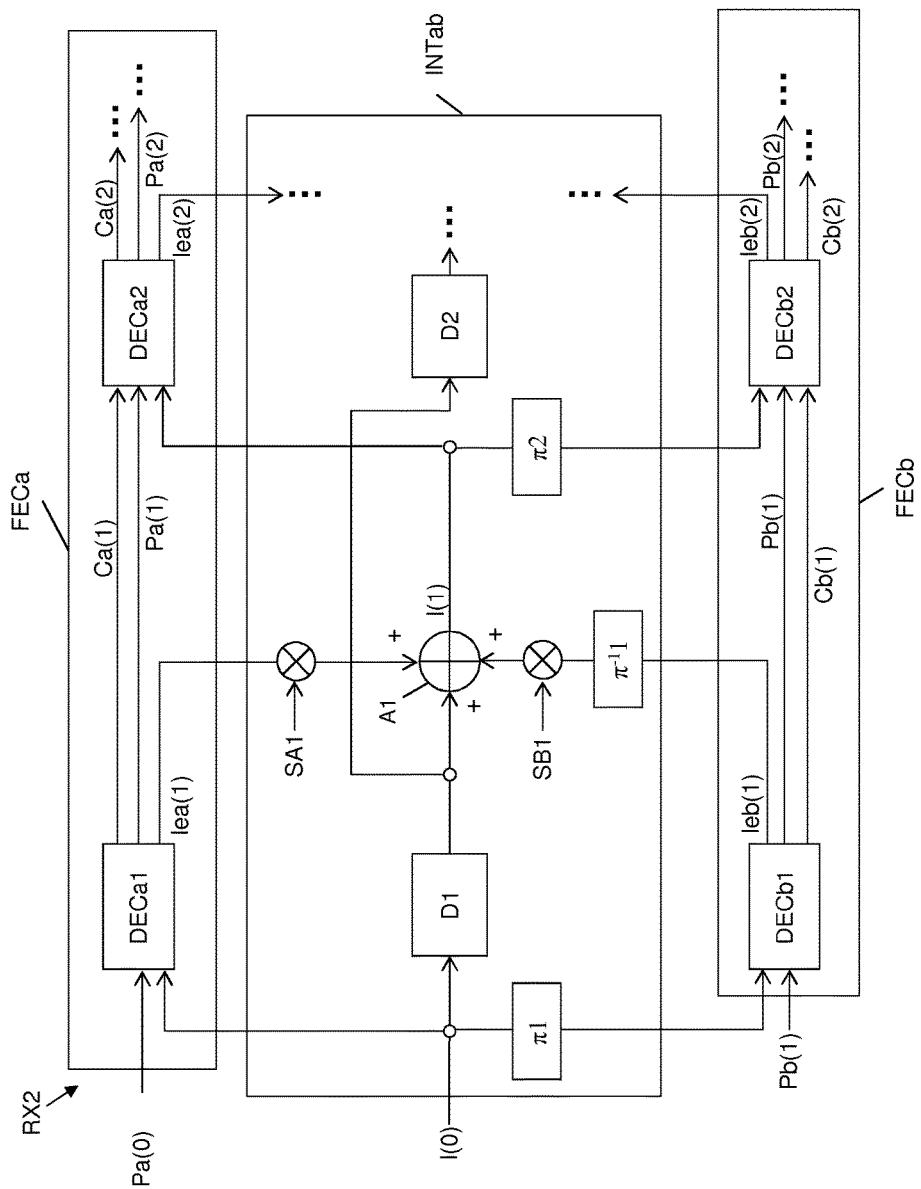
FIG. 4 is a block diagram of a portion of an optical coherent receiver according to a second embodiment of the present invention, in the second operating mode.

FIG. 4 shows an optical coherent receiver RX2 according to a second embodiment of the present invention.

According to the second embodiment, the FEC decoding algorithm implemented by each FEC decoding chain preferably provides, as an output of each iteration, only the extrinsic probabilities of the codeword bits, instead of their whole a posteriori probabilities (which also take into account the a priori probabilities). Hence, the states lea(i), leb(i) of the variable nodes corresponding to the message bits at the output of each iteration (both in the first operating mode and in the second operating mode) only comprises the extrinsic probabilities of the message bits, namely:

$$\sum_C Lea(1)_{VC} \quad [7a]$$

$$\sum_C Leb(1)_{VC} \quad [7b]$$

Hence, the merged state I(i) provided at each iteration of the algorithm in the second operating mode of the receiver RX2 comprises a posteriori probabilities of the message bits which are calculated, for each message bit, as the sum of its a priori probability, its extrinsic probabilities provided by the FEC decoding chain FECa and its extrinsic probabilities provided by the decoding chain FECb. It may be appreciated that the resulting a posteriori probability is exactly the same as that provided by equations [5] (for the first iteration) and [6] (for the second iteration). Optionally, the two extrinsic probabilities are weighted, before being added, by two weights SA1, SB1.

From the circuit point of view, the receiver RX2 differs from the receiver RX1 in that the intermediate circuit INTab comprises two multipliers (by SA1 and SB1) at the inputs of the adder which receive the extrinsic probabilities by the FEC chains FECa, FECb. Further, all the three inputs of the adder are additive (since the FEC chains provide extrinsic information only, the a priori probability shall be added—not subtracted—in order to provide the a posteriori probability). Further, the output of the adder is connected to the subsequent decoding blocks of the FEC decoding chains only, and not also to the subsequent delay line. The switches suitable for switching the receiver between the first and second operating mode are not shown in FIG. 4, for simplicity. The receiver is shown in FIG. 4 in its second operating mode.

This second embodiment exhibits the same advantages as the first one, namely flexibility (meaning that it may be easily configured to operate in different traffic capacity conditions) and optimization of the resources usage when the actual traffic capacity is lower than the maximum one.

Furthermore, also the second embodiment RX2 has the same variants as the first one, in particular: applicability to any type of error correcting code (block code or convolutional code, provided it outputs extrinsic information only), merging of the states of the variable nodes corresponding to the message bits occurring every arbitrary number of iterations, possibility to use different codes for calculating the first and second parity bits.

Figure 5:
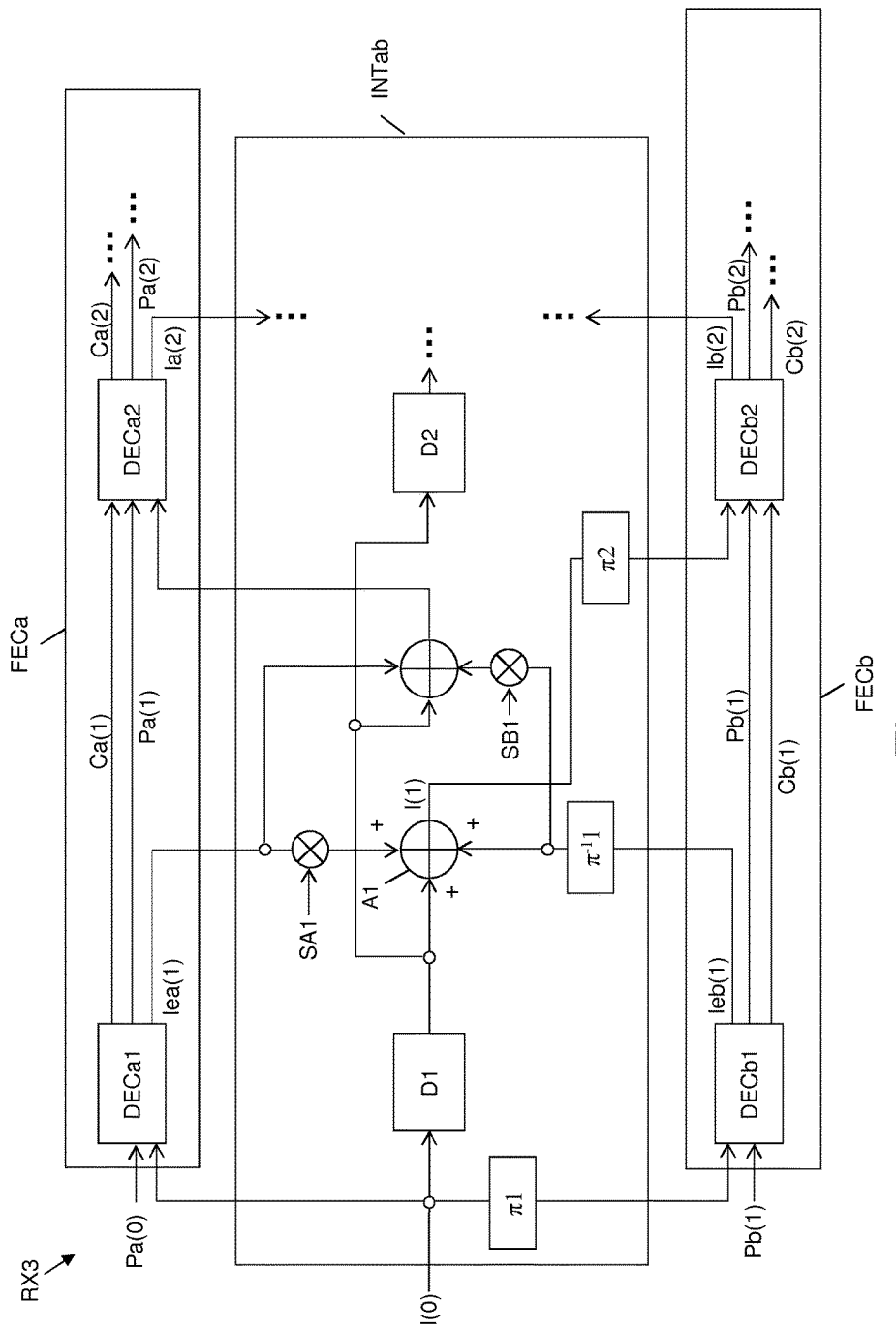
FIG. 5 is a block diagram of a portion of an optical coherent receiver according to a third embodiment of the present invention, in the second operating mode.

FIG. 5 shows an optical coherent receiver RX3 according to a third embodiment of the present invention.

Also according to the third embodiment, the FEC decoding algorithm implemented by each FEC decoding chain preferably provides, as an output of each iteration, only the extrinsic probabilities of the codeword bits. It shall be noticed however that, differently from the second embodiment of FIG. 4, the intermediate circuit of FIG. 5 guarantees that each decoding block receives at its message input the non-scaled, original extrinsic information which has been generated by the preceding decoding block. This allows preserving consistency between the states of the various variable nodes and check nodes, so as to avoid that the algorithm diverges.

The switches suitable for switching the receiver between the first and second operating mode are not shown in FIG. 5, for simplicity. The receiver is shown in FIG. 5 in its second operating mode.

This third embodiment exhibits the same advantages as the first one, namely flexibility (meaning that it may be easily configured to operate in different traffic capacity conditions) and optimization of the resources usage when the actual traffic capacity is lower than the maximum one.

Furthermore, also the third embodiment RX3 has the same variants as the first one, in particular: applicability to any type of error correcting code (block code or convolutional code, provided it outputs extrinsic information only), merging of the states of the variable nodes corresponding to the message bits occurring every arbitrary number of iterations, possibility to use different codes for calculating the first and second parity bits.

According to another embodiment (not shown in the drawings), the receiver is configured so that, when it is in its second operating mode, within each iteration of the algorithm the decoding blocks of the two aggregated FEC chains FECa, FECb operate as follows:

the decoding block DECAi of the FEC chain FEC provides a state Ia(i) of the variable nodes corresponding to the message bits, calculated using the state $Pa(0)$ of the variable nodes corresponding to the first parity bits as received from the component that precedes the FEC chains within the receiver (namely, the state of variable nodes corresponding to the first parity bits is not updated at the various algorithm iterations and the state of the first check nodes is reset at each algorithm iteration);

the state Ia(i) is permutated and provided to the corresponding decoding block DECbi of the FEC chain FECb;

the decoding block DECbi updates the received state Ia(i) into a state Ib(i) of the variable nodes corresponding to the permutated message bits, calculated using the state $Pb(0)$ of the variable nodes corresponding to the second parity bits as received from the component that precedes the FEC chains within the receiver (namely, the state of variable nodes corresponding to the second parity bits is never updated at the various algorithm iterations and the state of the second check nodes is reset at each algorithm iteration); and the state Ib(i) is counter-permutated and provided to the next algorithm iteration.

Hence, while in the previous embodiments two decoding blocks DECai, DECbi implementing a same algorithm iteration work in parallel (namely, they both receive a same joint state I(i−1) from the previous iteration and separately update it using their own parity bits, the two separate updated states being merged again before they are forwarded to the next iteration), according to this embodiment the two decoding blocks operate in a serial way (namely only one of them receives a state of the variable nodes corresponding to the message bits from the previous iteration, updates it using its own parity bits and provides the updated state to the other decoding block, that in turns further updates it using its own parity bits and forwards it to the next algorithm iteration).

From the circuit point of view, since all the decoding blocks use the original states of the first or second parity bits $Pa(0)$, $Pb(0)$, the intermediate circuit INTab preferably comprises—for each algorithm iteration—at least one delay line suitable for delaying the states $Pa(0)$, $Pb(0)$ before providing them at the parity inputs of the decoding blocks DECai, DECbi. Further, the parity input of each decoding block is provided with a switch switchable to selectively connect it to either the parity output of the preceding block within the same FEC chain (first operating mode of the receiver) or to the corresponding delay line within the intermediate circuit (second operating mode of the receiver).

Besides, since the states of the check nodes are preferably reset at the input of each decoding block in the second operating mode, the check input of each decoding block is preferably provided with a switch switchable to selectively connect it to (first operating mode of the receiver) or disconnected it from (second operating mode of the receiver) the check output of the preceding block within the same FEC chain.

Besides, the intermediate circuit INTab according to such embodiments preferably comprises, for each iteration, an interleaver configured to permute the state Ia(i) before it is provided to the decoding block DECbi and a de-interleaver configured to counter-permute the state Ib(i) before it is provided to the next algorithm iteration. Hence, the message input of each decoding block is preferably provided with a switch switchable to selectively connect it to either the message output of the preceding block within the same FEC chain (first operating mode of the receiver) or to the corresponding interleaver or de-interleaver within the intermediate circuit (second operating mode of the receiver).

It shall be noticed that, according to this latter embodiments, each algorithm iteration may comprise serial processing of both the FEC decoding chains FECa, FECb. This is however not limiting. According to advantageous variants, serial processing of both the FEC decoding chains FECa, FECb may be implemented every X iterations, while the other iterations comprise only the processing of either FECa or FECb.

The functions of the various elements shown in the drawings, including any functional blocks labeled as "device", "unit", "block" or "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the terms "processing unit", "device", "block" or "unit" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

The invention claimed is:

1. An optical coherent receiver comprising a number of decoding blocks, each decoding block being configured to implement an iteration of a forward error correction iterative message-passing decoding algorithm, said number of decoding blocks being distributed into at least two parallel chains of cascaded decoding blocks, wherein said optical coherent receiver also comprises at least one intermediate circuit interposed between said two parallel chains, wherein said optical coherent receiver is switchable between:
   a first operating mode, in which said intermediate circuit is inactive and each one of said two parallel chains separately implements said forward error correction message-passing decoding algorithm on a respective client channel; and
   a second operating mode, in which said intermediate circuit is active and said two parallel chains jointly implement said forward error correction message-passing decoding algorithm on a same client channel by cooperating through said intermediate circuit.

2. The receiver according to claim 1, wherein a first chain of cascaded decoding blocks comprise a first decoding block and a second chain of cascaded decoding blocks comprise a second decoding block, said first decoding block and said second decoding block being suitable for performing an i-th iteration of said algorithm.

3. The receiver according to claim 2, wherein in said first operating mode:
   said first decoding block is configured to receive from a preceding decoding block of said first chain a posteriori probabilities of message symbols of a first codeword of a first client channel as calculated at a preceding iteration of said algorithm based on redundancy symbols of said first codeword, and to update said a posteriori probabilities of said message symbols of said first codeword based on said redundancy symbols of said first codeword; and
   said second decoding block is configured to receive from a preceding decoding block of said second chain a posteriori probabilities of message symbols of a second codeword of a second client channel as calculated at a preceding iteration of said algorithm based on redundancy symbols of said second codeword, and to update said a posteriori probabilities of said message symbols of said second codeword based on said redundancy symbols of said second codeword.

4. The receiver according to claim 3, wherein in said second operating mode:
   said first decoding block is configured to receive from said intermediate circuit joint a posteriori probabilities of message symbols of a codeword of a client channel as calculated at a preceding iteration of said algorithm based on first redundancy symbols and second redundancy symbols of said codeword, and to calculate a posteriori probabilities of said message symbols of said codeword based on said first redundancy symbols only;
   said second decoding block is configured to receive from said intermediate circuit said joint a posteriori probabilities of message symbols of said codeword of said client channel as calculated at said preceding iteration of said algorithm based on said first redundancy symbols and said second redundancy symbols of said codeword, and to calculate a posteriori probabilities (lb(2)) of said message symbols of said codeword based on said second redundancy symbols only; and
   said intermediate circuit is configured to calculate updated joint a posteriori probabilities of said message symbols taking into account both said a posteriori probabilities calculated based on said first redundancy symbols and said a posteriori probabilities calculated based on said second redundancy symbols.

5. The receiver according to claim 4, wherein said a posteriori probabilities of said message symbols are in the form of log likelihood ratios, and wherein said intermediate circuit is configured to calculate said updated joint a posteriori probabilities of said message symbols as the summation of said a posteriori probabilities calculated based on said first redundancy symbols and said a posteriori probabilities calculated based on said second redundancy symbols, decreased by a priori probabilities of said message symbols.

6. The receiver according to claim 4, wherein said joint a posteriori probabilities of message symbols are calculated every X iterations of said algorithm, X being equal to or higher than 1.

7. The receiver according to claim 3, wherein in said second operating mode:
   said first decoding block is configured to receive from said intermediate circuit a posteriori probabilities of message symbols of a codeword of a client channel as calculated at a preceding iteration of said algorithm, and to update said a posteriori probabilities of said message symbols based on first redundancy symbols of said codeword; and
   said second decoding block is configured to receive from said first decoding block via said intermediate circuit said updated a posteriori probabilities of said message symbols and to further update them based on second redundancy symbols of said codeword.

8. The receiver according to claim 2, wherein in said first operating mode:
   said first decoding block is configured to receive from a preceding decoding block of said first chain a posteriori probabilities of message symbols of a first codeword of a first client channel as calculated at a preceding iteration of said algorithm based on redundancy symbols of said first codeword, and to calculate extrinsic probabilities of said message symbols of said first codeword based on said redundancy symbols of said first codeword;
   said second decoding block is configured to receive from a preceding decoding block of said second chain a posteriori probabilities of message symbols of a second codeword of a second client channel as calculated at a preceding iteration of said algorithm based on redundancy symbols of said second codeword, and to calculate extrinsic probabilities of said message symbols of said second codeword based on said redundancy symbols of said second codeword.

9. The receiver according to claim 8, wherein in said second operating mode:
- said first decoding block is configured to receive from said intermediate circuit joint a posteriori probabilities of message symbols of a codeword of a client channel as calculated at a preceding iteration of said algorithm based on first redundancy symbols and second redundancy symbols of said codeword, and to calculate extrinsic probabilities of said message symbols of said codeword based on said first redundancy symbols only;
- said second decoding block is configured to receive from said intermediate circuit said joint a posteriori probabilities of message symbols of said codeword of said client channel as calculated at said preceding iteration of said algorithm based on said first redundancy symbols and said second redundancy symbols of said codeword, and to calculate extrinsic probabilities of said message symbols of said codeword based on said second redundancy symbols only; and
- said intermediate circuit is configured to calculate updated joint a posteriori probabilities of said message symbols taking into account both said extrinsic probabilities calculated based on said first redundancy symbols and said extrinsic probabilities calculated based on said second redundancy symbols.

10. The receiver according to claim 9, wherein said extrinsic probabilities of said message symbols are in the form of log likelihood ratios, and wherein said intermediate circuit is configured to calculate said updated joint a posteriori probabilities of said message symbols as the summation of said extrinsic probabilities calculated based on said first redundancy symbols, said extrinsic probabilities calculated based on said second redundancy symbols, and a priori probabilities of said message symbols.

11. The receiver according to claim 10, wherein the intermediate circuit is also configured to multiply said extrinsic probabilities calculated based on said first redundancy symbols and said extrinsic probabilities calculated based on said second redundancy symbols by respective weights, before there are summed.

12. The receiver according to claim 4, wherein said first redundancy symbols of said codeword are calculated by applying a first error correcting code to said message symbols of said codeword and said second redundancy symbols of said codeword are calculated by applying a second error correcting code to a permutation of said message symbols of said codeword.

13. The receiver according to claim 12, wherein said first error correcting code and said second error correcting code are a low density parity check code.

14. The receiver according to claim 1, wherein said number of decoding blocks is distributed into M parallel chains of cascaded decoding blocks, M being equal to a maximum number of client channels which said receiver shall be able to receive and process.

15. A method for operating an optical coherent receiver comprising a number of decoding blocks, each decoding block being configured to implement an iteration of a forward error correction iterative message-passing decoding algorithm, said number of decoding blocks being distributed into at least two parallel chains of cascaded decoding blocks, wherein said optical coherent receiver also comprises at least one intermediate circuit interposed between said two parallel chains, wherein said method comprises switching said optical coherent receiver between:
- a first operating mode, in which said intermediate circuit is inactive and each one of said two parallel chains separately implements said forward error correction message-passing decoding algorithm on a respective client channel; and
- a second operating mode, in which said intermediate circuit is active and said two parallel chains jointly implement said forward error correction message-passing decoding algorithm on a same client channel by cooperating through said intermediate circuit.

* * * * *